(12) United States Patent
Masuda (10) Patent No.: US 8,704,531 B2
(45) Date of Patent: Apr. 22, 2014

(54) LOOP ELEMENT AND NOISE ANALYZER

(75) Inventor: Norio Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 503 days.

(21) Appl. No.: 12/735,994

(22) PCT Filed: Mar. 27, 2009

(86) PCT No.: PCT/JP2009/056275
§ 371 (c)(1),
(2), (4) Date: Aug. 31, 2010

(87) PCT Pub. No.: WO2009/119799
PCT Pub. Date: Oct. 1, 2009

(65) Prior Publication Data
US 2010/0321035 A1 Dec. 23, 2010

(30) Foreign Application Priority Data
Mar. 28, 2008 (JP) ................... 2008-087117

(51) Int. Cl.
*G01R 29/26* (2006.01)
*G01R 33/02* (2006.01)
*G01R 27/28* (2006.01)
*H02H 9/00* (2006.01)
*H01L 29/40* (2006.01)
*H01L 23/62* (2006.01)

(52) U.S. Cl.
USPC ............ 324/613; 324/258; 324/612; 361/56; 257/773; 257/355

(58) Field of Classification Search
USPC .................................. 324/249, 258, 613, 260
See application file for complete search history.

(56) References Cited

U.S. PATENT DOCUMENTS 4,214,210 A * 7/1980 O'Shea .................. 455/282
5,796,147 A * 8/1998 Ono .......................... 257/355
(Continued)

FOREIGN PATENT DOCUMENTS

JP 6-53311 2/1994
JP 7-58289 3/1995
(Continued)

OTHER PUBLICATIONS

Article JP3102389B2 translated on Sep. 19, 2012 for JP 11103018.*
(Continued)

*Primary Examiner* — Jermele M Hollington
*Assistant Examiner* — Christopher McAndrew
(74) *Attorney, Agent, or Firm* — McGinn I.P. Law Group, PLLC (57) ABSTRACT

There is provided a shield-structured loop element which can suppress noise via a silicon substrate and can be manufactured by a semiconductor process. The loop element includes: a first well of a first polarity that is formed on a substrate; a deep well of a second polarity that is formed below the first well; a ring-shaped second well of a second polarity that is formed on the deep well along an outer periphery of the deep well; a third well of the first polarity that is formed in an island area surrounded by the deep well and the second well; a looped conductor that is formed in a layer above the third well and has smaller outer dimensions than those of the third well; and a first path that connects the second well to a bias power supply. The second well and the deep well are electrically connected to each other.

20 Claims, 5 Drawing Sheets

(56) References Cited

U.S. PATENT DOCUMENTS

| | | | |
|---|---|---|---|
| 6,501,169 B1 * | 12/2002 | Aoki et al. | 257/700 |
| 2003/0155614 A1 | 8/2003 | Kaneko et al. | |
| 2004/0021463 A1 | 2/2004 | Miyazawa et al. | |
| 2006/0180871 A1 | 8/2006 | Yamamoto et al. | |
| 2007/0008667 A1 * | 1/2007 | Steinhoff | 361/56 |
| 2007/0216408 A1 * | 9/2007 | Ando et al. | 324/258 |
| 2008/0272495 A1 * | 11/2008 | Nakashiba | 257/773 |

FOREIGN PATENT DOCUMENTS

| | | | |
|---|---|---|---|
| JP | 11-94888 | 4/1999 | |
| JP | 11-103018 | 4/1999 | |
| JP | 11103018 A * | 4/1999 | H01L 27/04 |
| JP | 2002-76278 | 3/2002 | |
| JP | 2003-197791 | 7/2003 | |
| JP | 2004-69337 | 3/2004 | |
| JP | 2006-24817 | 1/2006 | |
| JP | 2006-228942 | 8/2006 | |
| JP | 2007-189499 | 7/2007 | |
| JP | 2008-25860 | 10/2008 | |

OTHER PUBLICATIONS

Shawn D. Rogers, "Electromagnetic-Bandgap Layers for Broad-Band Suppression of TEM Modes in Power Planes" IEEE Transactions on Microwave Theory and Techniques, vol. 53, No. 8, Aug. 2005, pp. 2495-2505.

* cited by examiner

LOOP ELEMENT AND NOISE ANALYZER

TECHNICAL FIELD

The present invention relates to a loop element for magnetic field measurement and a noise analyzer on which the effect of noise conducted through a ground in a silicon substrate is eliminated.

BACKGROUND ART

As the integration density in IC (integrated circuit) or IC package level increases for higher speed and higher frequency, electromagnetic noise occurring from such components as circuits and wiring incorporated in ICs and wiring on interposers can affect other circuits and ICs. The electromagnetic noise causes electromagnetic interference and an electromagnetic interference based drop in performance, which are becoming manifest as the improvement of the IC operating speed, miniaturization, and the incorporation of radio frequency (RF) circuits advances.

To evaluate the foregoing noise occurring from an IC, there are known methods of measuring the magnetic field leaking from the IC and wiring to identify the circuit that generates the magnetic field, and determining a high-frequency current from the magnetic field to search for the noise source or propagation path.

For example, PTL 1 describes an example of a test apparatus where a magnetic field sensor intended for magnetic field measurement is built in an IC chip. In PTL 1, an antenna that is composed of looped wiring isolated from other circuits of the LSI (Large-Scale Integrated circuit) is formed on the IC chip, whereby high-frequency electromagnetic radiation noise occurring in the IC chip is measured. It is described that a plurality of such antennas can be arranged to identify the source of the electromagnetic radiation noise easily.

In PTL 1, the looped wiring or antennas are also arranged on devices to be measured, such as a transistor device. The antennas detect the magnetic fields around the devices to determine the intensity of noise leaking from the devices.

PTL 2 relates to a semiconductor apparatus in which an antenna and a semiconductor integrated circuit are integrated. PTL 3 relates to a looped magnetic sensor. PTL 4 deals with the formation of a metal thin film under an antenna coil. PTL 5 relates to a semiconductor intended for power supply circuits. PTL 6 deals with a semiconductor apparatus which has a small-sized antenna circuit on a semiconductor substrate. In PTL 7 and PTL 8, semiconductors of different polarities are joined to form a circuit for preventing noise interference.

CITATION LIST

Patent Literature

{PTL 1} JP-A-11-103018
{PTL 2} JP-A-2002-076278
{PTL 3} JP-A-2004-069337
{PTL 4} JP-A-2006-024817
{PTL 5} JP-A-2003-197791
{PTL 6} JP-A-2007-189499
{PTL 7} JP-A-06-053311
{PTL 8} JP-A-07-058289

SUMMARY OF INVENTION

Technical Problem

The test apparatus of PTL 1 where magnetic field sensors intended for magnetic field measurement are built in an IC chip is useful in searching for a noise source, but with the problem that it is difficult to identify the propagation path of noise if the circuit has a high degree of integration.

Semiconductor processes such as a CMOS (Complementary Metal Oxide Semiconductor) process are becoming finer and finer. The degree of integration inside an LSI (Large Scale Integration) chip is becoming accordingly higher, and the distances between elements and semiconductor IPs (Intellectual Properties) closer. If the looped wiring is formed by using a metal layer lying close to the silicon substrate, the ground of the silicon substrate comes close. It follows that the looped wiring detects the resultant of magnetic fields such as ones from elements directly below, ones from adjoining elements, ones caused by conductive noise via the ground layer on the silicon substrate, and ones coming from outside the LSI chip.

As for the conductive noise via the silicon substrate, noise resulting from a circuit element lying far from an antenna can cause a magnetic field in the vicinity of the loop element and possibly be observed as high noise. In such a case, the measurement method of observing only the output of each piece of looped wiring may determine an element in an erroneous position to be the noise source.

The looped wiring also has a manufacturing problem. When the looped wiring is made of metal wiring, it is ideal that no other wiring or circuit is arranged in the vicinity of the looped wiring or inside the loop. The use of a fine semiconductor process involves flattening processing for eliminating irregularities on the substrate surface, which can sometimes break the wiring. To avoid this, a conductor piece called dummy metal needs to be provided inside the loop so as to maintain the conductor density within certain values. The provision of the dummy metal, however, fills up the interior of the loop with a conductor, which obstructs the passing of a magnetic field through the loop plane.

In PTL 2, additional second and third wells are not provided aside from the antenna line. In PTL 3 and PTL 4, the shield is not made of a well on the semiconductor substrate. In PTL 5 to PTL 8, a third well greater than the looped wiring is not provided under the looped wiring.

The inventions of the foregoing PTL 2 to PTL 8 therefore have the problem of insufficient blocking of conductive noise.

The present invention has been achieved in view of the foregoing. It is an object of the present invention to provide a loop element for magnetic field measurement and a noise analyzer which can be installed in an LSI chip and on which the effect of noise conducted through the ground of the silicon substrate is eliminated

Solution to Problem

To solve the foregoing problems, a loop element according to the present invention includes: a first well of a first polarity that is formed on a substrate; a deep well of a second polarity that is formed below the first well; a ring-shaped second well of a second polarity that is formed on the deep well along an outer periphery of the deep well; a third well of the first polarity that is formed in an island area surrounded by the deep well and the second well; a looped conductor that is formed in a layer above the third well and has smaller outer dimensions than those of the third well; and a first path that connects the second well to a bias power supply. The second well and the deep well are electrically connected to each other.

To solve the foregoing problems, a noise analyzer according to the present invention includes: the foregoing loop element; a looped conductor that is arranged independent from the loop element; measuring circuits that measure voltages at terminals of the loop element and the looped conductor, respectively; and an analysis circuit that performs a computation to determine a difference between a measurement of the voltage induced across the terminals of the loop element and a measurement of the voltage induced across the terminals of the looped conductor.

Advantageous Effects of Invention

According to the present invention, the deep well of the second polarity formed below the first well and the ring-shaped second well of the second polarity formed on the deep well are connected to the bias power supply. Such a connection can electrically isolate the first well of the first polarity formed on the substrate from the third well of the first polarity formed in the island area surrounded by the deep well and the second well, thereby preventing a conductive noise current from flowing directly into the third well. It is therefore possible to provide a loop element for magnetic field measurement which can be installed in an LSI chip and on which the effect of noise conducted through the ground of the silicon substrate is eliminated. It is also possible to provide a noise analyzer using the loop element.

BRIEF DESCRIPTION OF DRAWINGS

FIG. 2b A cross-sectional view taken along the line A-A' of FIG. 2a.

REFERENCE SIGNS LIST 1a, 1b: LSI chip
2a, 2b: Pad
3: Ball
4a, 4b, 4c: Semiconductor IP
5: Noise source
6a, 6b: Conductive noise propagation path
7a, 7b: Electromagnetic noise propagation path
8: Electromagnetic noise propagation path
9: Conductive noise propagation path
10: Ground layer
11: Loop element
12: Measurement circuit
13: Shield member
14: Dummy metal
15: Protective film
20: P-well (first well of a first polarity)
21: N-well ring pattern (ring-shaped second well of a second polarity)
22: Deep N-well (deep well of the second polarity)
23: P-well (third well of the first polarity)
24: Loop wiring
25: Lead
26: Shield pattern
27: Via
28: Ground wiring
29: Bias power supply wiring
30: Pad
31: Well contact
32: Contact
41: Dummy metal
42: Dummy metal
43: Opening
44: Dummy metal
50: Loop antenna
51: Loop antenna
52: Analysis circuit
60: Loop element

DESCRIPTION OF EMBODIMENTS

Next, exemplary embodiments of the present invention will be described in detail with reference to the drawings.

First Exemplary Embodiment

Figure 1:
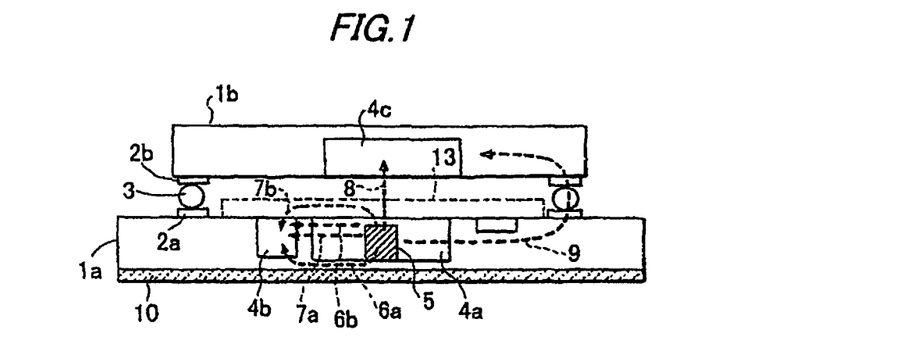
FIG. 1 A cross-sectional view of a SiP having an LSI chip that includes a loop element according to a first exemplary embodiment of the present invention.

FIG. 1 is a cross-sectional view of a SiP (System in Package) having a chip that includes a loop element according to a first exemplary embodiment of the present invention. The SiP shown in FIG. 1 includes two LSI chips 1a and 1b. The LSI chip 1b is stacked on the LSI chip 1a via respective pads 2a and 2b and balls 3 interposed between the pads 2a and 2b.

A plurality of semiconductor IPs 4a and 4b are formed inside the LSI chip 1a. A circuit to be a noise source 5 is arranged in the semiconductor IP 4a. Conductive noise propagation paths 6a and 6b and electromagnetic noise propagation paths 7a and 7b are formed inside the LSI chip 1a as paths for conductive noise and electromagnetic noise to propagate through, respectively.

The noise pertaining to the conductive noise propagation paths 6a and 6b and the electromagnetic noise propagation paths 7a and 7b in the LSI chip 1a is electromagnetic interference (EMI) occurring in the functional block libraries of electronic circuits called semiconductor IPs or between the semiconductor IP 4a and the semiconductor IP 4b which are laid out on the same LSI chip 1a. The EMI corresponds to intra-system interference. The conductive noise propagation paths 6a and 6b are the propagation paths of conductive noise via a ground. The electromagnetic noise propagation paths 7a and 7b are the propagation paths of electromagnetic noise between on-chip circuits.

Similarly, an electromagnetic noise propagation path 8 and a conductive noise propagation path 9 are formed between the LSI chips 1a and 1b as the paths for electromagnetic noise and conductive noise to propagate through, respectively. The electromagnetic interference occurring in the electromagnetic noise propagation path 8 and the conductive noise propagation path 9 corresponds to inter-system interference if the LSI chip 1a and the LSI chip 1b are regarded as respective independent systems. The electromagnetic noise propagation path 8 is the propagation path of electromagnetic noise through space between the LSI chips 1a and 1b. The conductive noise propagation path 9 is the propagation path of conductive noise between the LSI chips 1a and 1b.

When a characteristic degradation ascribable to electromagnetic interference occurs in the LSI chips 1a and 1b, it is needed to identify the properties and the propagation paths of the noise. To put it schematically, there are noise that pertains to the electromagnetic noise propagation paths 7a and 7b through spatial coupling by means of electric and magnetic fields, noise that pertains to the conductive noise propagation path 6a through a ground layer 10 on the silicon substrate, conductive noise that is conducted through IP-connecting wiring, etc. Depending on the types and propagation paths of such noises, different countermeasures need to be selected at the design phase of the LSI.

For example, conductive noise pertaining to the conductive noise propagation path 6a comes through the ground layer 10 which is arranged on the substrate of the LSI chip 1a. As a measure to suppress the conductive noise, the design technique to select is such as laying out the susceptible semiconductor IP 4b away from the noise source 5.

Conductive noise pertaining to the conductor noise propagation path 6b may come through not-shown power supply or ground wiring. As a measure to suppress the conductive noise, the design technique to select is such as electrically decoupling the power supply or ground wiring.

The electromagnetic noise pertaining to the electromagnetic noise propagation paths 8 and 7b results from the coupling of an electromagnetic field leaking from the chip 1a with the semiconductor IPs 4c and 4b. As a measure to suppress the electromagnetic noise, the design technique to select is such as laying out the susceptible semiconductor IPs at far distances or interposing a shield member 13 between the LSI chips 1a and 1b. In particular, to measure the magnetic field of the electromagnetic noise propagation path 7b passing through the shield member 13, it is needed to provide a loop element inside the LSI chip 1a.

Figure 2A:
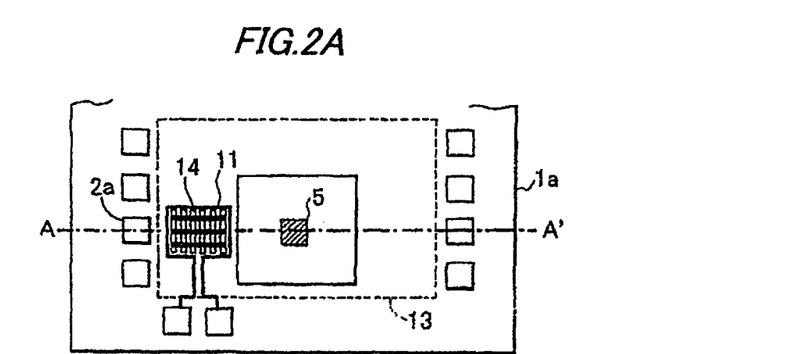
FIG. 2a A top view of the LSI chip that includes the loop element according to the first exemplary embodiment of the present invention.
Figure 2B:
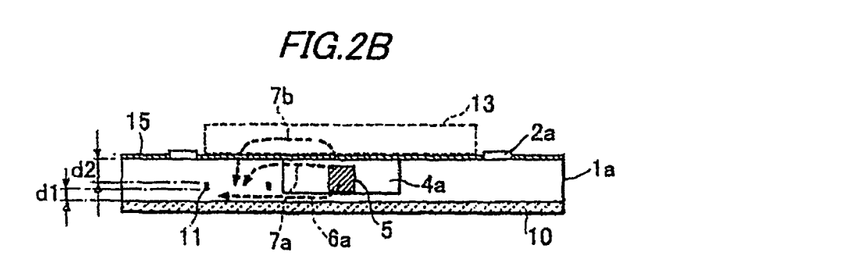

FIGS. 2a and 2b show an example where the loop element according to the present exemplary embodiment is arranged in the LSI chip 1a. FIG. 2b is a cross-sectional view taken along the line A-A' of FIG. 2a. The loop element 11 for measuring noises that occur in the LSI chip 1a and pertain to the electromagnetic noise propagation paths 7a and 7b and the conductive noise propagation path 6a separately is formed by using a semiconductor process. The surface of the LSI chip 1a, except the pads 2a, is covered with a protective film 15.

The loop element 11 is metal wiring formed next to the semiconductor IP 4a. When a magnetic field penetrates the loop element 11, a voltage proportional to the magnitude of change of the magnetic field occurs and is measured across the loop element 11. The loop element 11 is an independent element of metal wiring, not directly connected with the noise source 5.

The magnetic fields for the loop element 11 to detect include ones via the conductive noise propagation path 6a, the electromagnetic noise propagation path 7a, and the electromagnetic noise propagation path 7b. The magnetic field via the conductive noise propagation path 6a refers to one that a noise current conducted through the ground layer 10 generates in the vicinity of the loop element 11. The magnetic field via the electromagnetic noise propagation path 7a refers to one that occurs from the noise source 5, propagates through the LSI chip 1a, and reaches the loop element 11. The magnetic field via the electromagnetic noise propagation path 7b refers to one that once emerges from the surface of the LSI chip 1a before reaching the loop element 11.

According to the design rule of the semiconductor manufacturing process, when the loop element 11 is made of metal layer wiring, the distance d1 between the ground layer 10 and the loop element 11 is smaller in value than the distance d2 between the surface of the LSI chip 1a and the loop element 11. Here, d1 has a value of approximately one severalth to one tenth of d2. The loop element 11 therefore needs to have a function of reducing conductive noise that propagates the conductive noise propagation path 6a so that the magnetic field component occurring in the noise current as the conductive noise will not be strongly observed.

Figure 3:
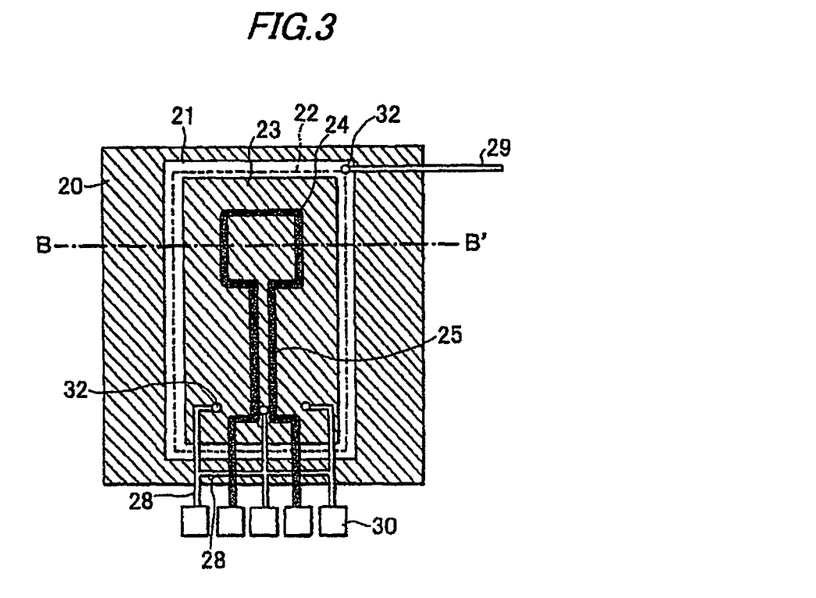
FIG. 3 A top view of the LSI chip that includes the loop element according to the first exemplary embodiment of the present invention.
Figure 4:
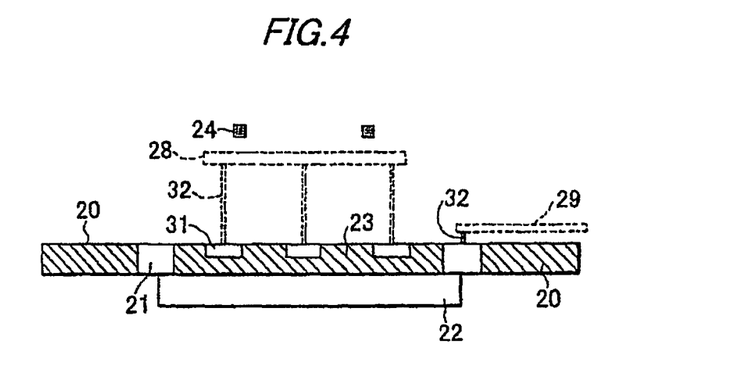
FIG. 4 A cross-sectional view taken along the line B-B' of FIG. 3.

An example of the structure of such a loop element 11 will be described in conjunction with FIGS. 3 and 4. FIG. 3 is a view of the LSI chip 1a from above. FIG. 4 is a cross-sectional view taken along the line B-B' of FIG. 3. While FIG. 2a shows the case where dummy metals 14 are arranged inside the loop element 11, the dummy metals 14 are omitted in FIGS. 3 and 4 for convenience' sake.

The loop element of FIGS. 3 and 4 has a shield structure, and is capable of precluding the noise via the ground layer 10 from reaching directly below the loop element and generating a magnetic field to affect the output of the loop element.

As employed herein, the loop element includes loop wiring 24 and leads 25 connected at the respective ends, which constitute a looped conductor, and pads 30 and the shield structure. The loop element is made of metal wiring. The two terminals of the looped conductor composed of the loop wiring 24 and the leads 25 are connected to the respective pads 30, so that a voltage induced in the loop wiring 24 can be measured from outside the LSI chip 1a through the leads 25 and the pads 30. It is therefore possible to determine the magnetic field occurring in the loop plane of the loop wiring 24 from the voltage if an appropriate magnetic field calibration technique is applied.

Next, the shield structure will be described. The shield structure includes well structures on the silicon substrate, which is the base of the LSI chip 1a, and connection elements such as pads 30 and ground wiring 28 which are formed in the metal layer.

The ground layer 10 is made of a first well of a first polarity on the silicon substrate. A P-type semiconductor is often used for the first well of the first polarity. In the present exemplary embodiment, the first well of the first polarity is composed of a P-type well (hereinafter, abbreviated as "P-well") 20. The P-well 20 is a ground common to circuits other than the loop element, and provides a noise detouring path represented by the conductive noise propagation path 6a.

To block the detouring path, a deep well of a second polarity different from the polarity of the first well, which is intended to provide a different type of power supply, is utilized. The deep well of the second polarity is formed below the first well of the first polarity. In the present exemplary embodiment, the deep well of the second polarity is composed of an N-type deep well (hereinafter, abbreviated as "deep N-well") 22. The deep N-well 22 is formed below the first well or P-well 20.

In addition, a second well of the second polarity, which is different from the polarity of the first well and the same as that of the deep well, is formed in a ring shape around the loop element. An N-type semiconductor is often used for the ring-shaped second well of the second polarity. In the present exemplary embodiment, the ring-shaped second well of the second polarity is composed of an N-type well ring pattern (hereinafter, abbreviated as "N-well ring pattern") 21.

FIGS. 3 and 4 show an example of the N-well ring pattern 21. The N-well ring pattern 21, or the second well of the second polarity, and the deep N-well 22, or the deep well, are electrically connected to each other, thereby forming a structure to separate part of the P-well 20, or the first well of the first polarity. A P-type well (hereinafter, abbreviated as "P-well") 23 lying in the separated area constitutes a third well of the first polarity. The P-well 23 is formed in the isolated area of island shape that is surrounded by the N-well ring pattern 21 on the deep N-well 22. In the present exemplary embodiment, the loop wiring 24 and the leads 25, or the looped conductor, are formed in a layer above the third well or P-well 23, and have outer dimensions smaller than those of the P-well 23.

The N-well ring pattern 21 is connected with bias power supply wiring 29 through a contact 32. In the present exemplary embodiment, the path including the contact 32 and the bias power supply wiring 29 connects the second well or N-well ring pattern 21 to a bias power supply (not shown), thereby forming a first path for supplying the bias potential. The N-well ring pattern 21 electrically separates the P-well 23 from the P-well 20.

Since the P-well 23 can be separated from the P-well 20, which is the surrounding ground, it is possible to preclude a conductive noise current from directly flowing into the P-well 23. Such a deep well-based structure is used to separate the grounds of circuits that use different types of power supplies. It has been reported that such a structure is also effective against high-frequency noise.

To increase the sensitivity of the loop element increases the outer dimensions of the loop wiring 24. Making a measurement at the center of the LSI chip 1a makes the leads 25 longer. If the P-well 23 is consequently increased in area, the P-well 23 may sometimes have different potentials from one location to another. The reason is that the P-well 23 has high resistance unlike ground planes and the like on a printed circuit board. If the N-well ring pattern 21 is not able to be increased in width, the P-well 20 and the P-well 23 may be electromagnetically coupled with each other to form a new path for noise intrusion.

As shown in FIGS. 3 and 4, the P-well 23 is then connected with the ground wiring 28 through contacts 31. The ground wiring 28 is connected to pads 30. The pads 30 are connected to an independent ground (not shown) outside the LSI chip 1a. In the present exemplary embodiment, such paths constitute a second path that electrically connects the third well to an independent ground. Since there is provided a ground independent from the circuits on the LSI chip 1a, it is possible to operate the P-well 23 as a ground effectively and lead incoming high-frequency noise to an external ground. Examples of the external ground include the ground plane of an interposer or printed circuit board on which the LSI chip 1a is mounted.

Second Exemplary Embodiment

Figure 5:
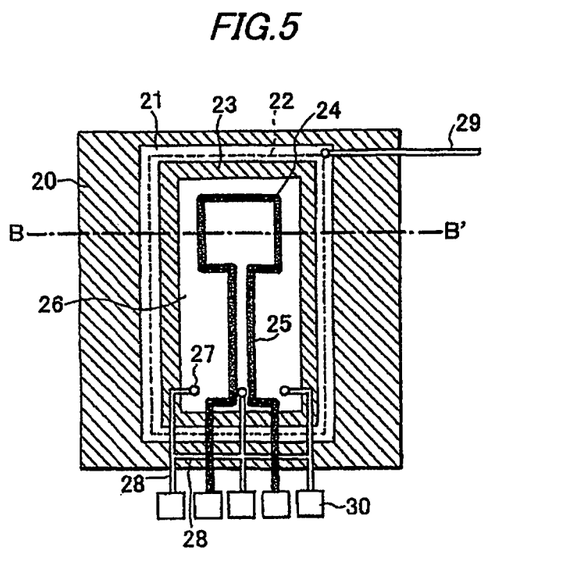
FIG. 5 A top view of an LSI chip that includes a loop element according to a second exemplary embodiment of the present invention.
Figure 6:
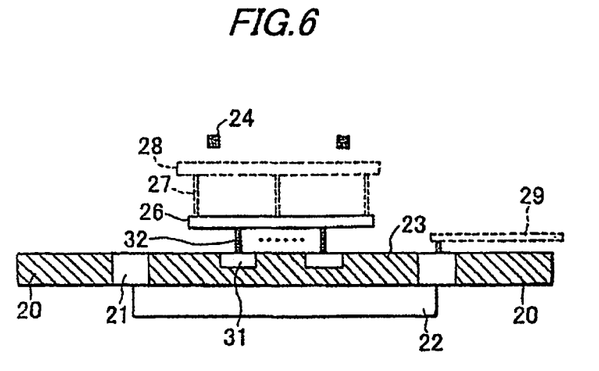
FIG. 6 A cross-sectional view taken along the line B-B' of FIG. 5.

FIGS. 5 and 6 show a loop element according to a second exemplary embodiment of the present invention.

The foregoing deep well-based shield structure of the loop element according to the first exemplary embodiment can block noise that propagates over the P-well 20 and enters the loop element. However, the metal layer that forms the loop wiring 24 sometimes provides only a distance d1 of one micrometer or so, coming into proximity to the ground. In such a case, the P-well 20 could be electromagnetically coupled with the loop wiring 24 and the leads 25 to create a new noise detouring path.

Thus, in the loop element according to the second exemplary embodiment shown in FIGS. 5 and 6, a shield pattern 26 which constitutes a shield conductor of greater area than the loop wiring 24 is interposed between the loop wiring 24 and leads 25 and the P-well 23 so that the P-well 20 is prevented from being coupled with the loop wiring 24 and the leads 25. The shield pattern 26 may be applied to any shield conductor that is formed to cover the loop wiring 24 and the leads 25, or the looped conductor. For example, the shield pattern 26 need only have dimensions at least similar to those of the loop wiring 24 and the leads 25.

The shield pattern 26 is connected to pads 30 independent of the loop element, through contacts, 32, vias 27, and ground wiring 28 that are connected to the P-well 23. The pads 30 are connected by bonding wires or the like to a ground that is formed on an interposer or printed circuit board on which the LSI chip 1a is mounted. In the present exemplary embodiment, such paths constitute a third path that electrically connects the shield pattern 26 constituting the shield conductor to an independent ground outside the LSI chip 1a. Since the ground on the interposer or printed circuit board is independent from that of the circuits on the LSI chip 1a, it is possible to reduce the intrusion of high-frequency noise.

Since it is not possible to form the planar shield pattern 26 by a fine semiconductor process, metal wiring is laid in a mesh configuration. The spacing of the metal wiring can be adjusted to control the conductor density.

In the second exemplary embodiment, the shield pattern 26 and the P-well 23 can be electrically connected so that the P-well 23 is connected to an external ground through the shield pattern 26. In FIG. 6, the P-well 23 and the shield pattern 26 are connected to each other by a plurality of contacts 32 and well contacts 31.

Third Exemplary Embodiment

Figure 7:
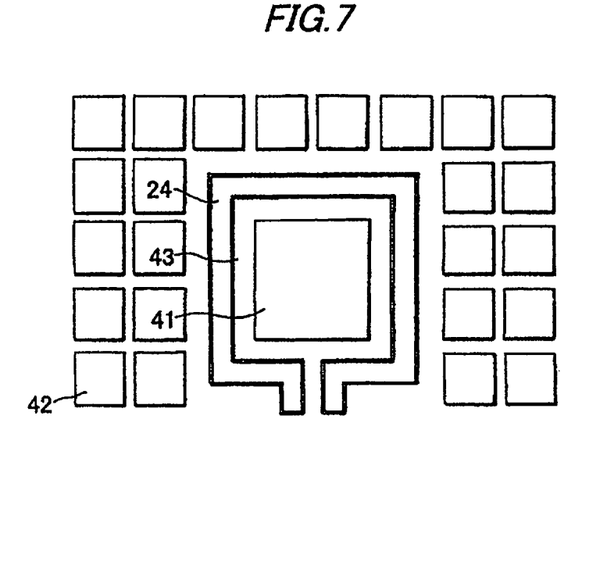
FIG. 7 A diagram for explaining a loop element according to a third exemplary embodiment of the present invention.

FIG. 7 shows a loop element according to a third exemplary embodiment of the present invention.

When a piece of wiring having a large opening area such as the loop wiring 24 is formed by metal wiring, a question arises how to conform to the design standard about the conductor density. The question is particularly crucial when a fine process with a gate length of 90 nm or less is employed for manufacturing.

As shown in FIG. 2b, dummy metals 14 are arranged to maintain the conductor density with a certain range. The dummy metals 14, if carelessly arranged, can fill up the opening of the loop wiring and block the passage of the magnetic field, thereby hindering the operation of the loop element. Layout design for suppressing the effect of the dummy metals is thus needed.

For example, assuming that the loop wiring 24 has outer dimensions of the order of 10 micrometers to 100 micrometers, the noise source 5 and the like to be measured are also positioned at similar distances. In such a case, the source of the magnetic field noise lies in an area extremely close to the loop element, and it is only one of the sides of the loop wiring 24 close to the noise source 5 that effectively functions as a loop antenna.

The loop element according to the third exemplary embodiment shown in FIG. 7 then deals with an example where a rectangular dummy metal 41, a conductor not connected with the loop wiring 24, is arranged in the center area where it has less effect on the loop operation.

In the loop element shown in FIG. 7, there is an opening 43 between the loop wiring 24 and the dummy metal 41, and it is possible to detect the magnetic field that passes the opening 43. In addition, dummy metals 42 are arranged outside the loop wiring 24 so that there is an annular opening in the vicinity of the loop wiring 24, which suppresses the effect on the loop wiring 24. The dummy metals 42 may be made of conductor wiring in the metal layer by a semiconductor process.

Fourth Exemplary Embodiment

Figure 8:
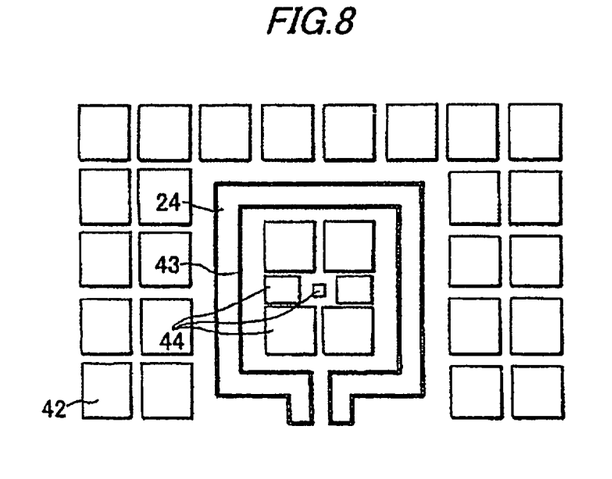
FIG. 8 A diagram for explaining a loop element according to a fourth exemplary embodiment of the present invention.

FIG. 8 shows a loop element according to a fourth exemplary embodiment of the present invention.

Some fine processes for manufacturing semiconductors define the lower and upper limits of the conductor density. When the loop wiring 24 reaches outer dimensions as large as around 100 micrometers, the upper limit of the conductor density rule may fail to be satisfied in the center area if the dummy metal 41, a single piece of metal, is arranged in the center area via an annular opening 43 as in the loop element according to the third exemplary embodiment shown in FIG. 7. Then, in a possible design technique, the dummy metal may be designed to be composed of a plurality of conductors, not a single conductor, to satisfy the conductor density standard.

In the loop element according to the fourth exemplary embodiment shown in FIG. 8, the dummy metal, a conductor that is arranged inside the looped conductor so as to satisfy the conductor density rule, is divided into a plurality of dummy metals 44 which are arranged in the center area. Each of the dummy metals 44 may be made of conductor wiring in the metal layer by a semiconductor process.

Here, smaller conductors may be arranged closer to the center of the loop. This can change the opening ratio in the center area where the dummy metals concentrate, thereby lowering the conductor density in the center area. Possible design techniques other than that of FIG. 8 include forming the dummy metals 44 in a mesh-like configuration.

As mentioned previously, each of the conductors arranged inside the looped conductor may be made of conductor wiring in the metal layer by a conductor process.

Fifth Exemplary Embodiment

Figure 9:
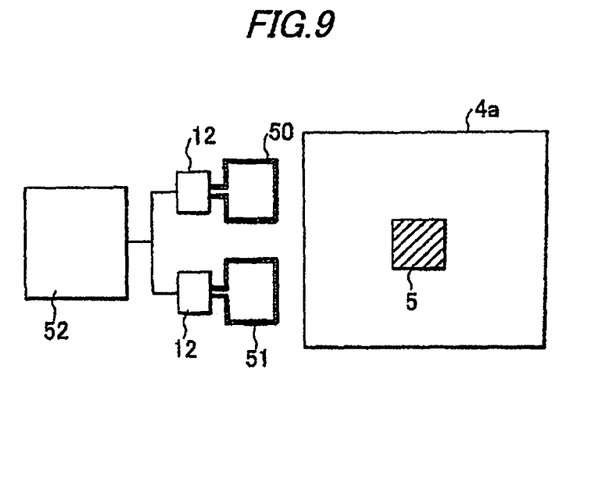
FIG. 9 A block diagram of a noise analyzer that uses a loop element according to a fifth exemplary embodiment of the present invention.

FIG. 9 is a block diagram of a noise analyzer that uses a loop element according to a fifth exemplary embodiment of the present invention.

The noise analyzer shown in FIG. 9 includes a loop antenna 50 which is composed of a loop element having the shield function described above, and a loop antenna 51 which has no such shield function and is composed of a looped conductor arranged independent of the loop antenna 50. The two types of loop elements are arranged in the vicinity of a noise source 5. With the foregoing shield structure, the loop antenna 50 has the function capable of reducing the noise via the ground layer 10. The loop antenna 51 has no such shield structure, no noise suppressing function described above.

Suppose that the magnetic field occurring in the vicinity of the loop antennas 50 and 51 via the conductive noise propagation path 6a of FIG. 2a seen above is H1 (A/m), and the magnetic field via the electromagnetic noise propagation paths 7a and 7b is H2 (A/m). The loop antennas 50 and 51 are located at equal distances from the noise source 5. In such a case, the loop antenna 50 only detects the magnetic field H2 since the conductive noise through the conductive noise propagation path is reduced by the presence of the shield structure. Meanwhile, the loop antenna 51 detects a magnetic field H3 that includes both H1 and H2, i.e., H3=H1+H2 since there is no shield structure.

The output voltage V1 of the loop antenna 50 and the output voltage V3 of the loop antenna 51 are then detected by measurement circuits 12, where V1 (V)=Ca×H2 and V3 (V)=Cb×H3. Ca and Cb are coefficients for associating the magnetic fields and output voltages of the respective loop antennas 50 and 51. Using the measurements V1 and V3 of the detected output voltages of the loop antennas 50 and 51, an analysis circuit 52 performs appropriate processing for magnetic field calibration to determine H3−H2=V3/Cb−V1/Ca, whereby H1 is determined.

Consequently, according to the present exemplary embodiment, the component of the magnetic field H1 occurring in the vicinity of the loop antennas 50 and 51 via the conductive noise propagation path 6a and that of the magnetic field H2 via the electromagnetic noise propagation paths 7a and 7b can be separated to directly determine the values of H1 and H2. It is therefore possible to compare the magnetic field components of the respective paths for appropriate noise suppression design.

As described above, according to the present exemplary embodiment, the loop element 11 having the shield structure is arranged next to (in the vicinity of) the noise source 5 to be measured. This makes it possible to separate the magnetic field resulting from the electromagnetic noise propagation paths 7a and 7b from that resulting from the conductive noise propagation path 6a. In contrast, in the conventional examples, the loop element is placed directly above a device, which makes the separation difficult.

Sixth Exemplary Embodiment

Figure 10:
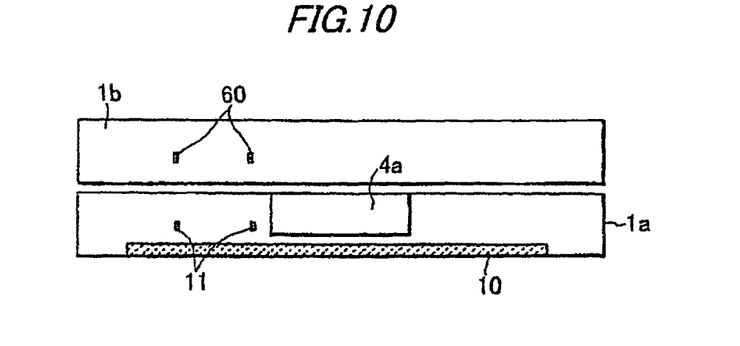
FIG. 10 A diagram for explaining an on-chip antenna that uses a loop element according to a sixth exemplary embodiment of the present invention.

FIG. 10 shows a case where a loop element according to a sixth exemplary embodiment of the present invention is used as an on-chip antenna for extreme proximity communication.

The on-chip antenna shown in FIG. 10 is for use in a communication apparatus that performs non-contact communication between LSI chips 1a and 1b. The communication apparatus includes loop elements 11 and 60 which are opposed to each other. The loop elements 11 and 60 are used as loop antennas. When the loop element 11 is excited by a high frequency signal and the loop element 60 receives, noise could leak from the loop element 11 via the ground layer 10 and change the ground potential of other circuits, affecting the operation. The use of the shield-structured loop element as in the sixth exemplary embodiment allows a reduction of the conductive noise via the ground, so that relatively high power can be used for oscillation with an extended communication range.

As has been described above, according to the foregoing exemplary embodiments, it is possible to provide an on-chip loop element that has a structure for shielding conductive noise propagating via the ground of the silicon substrate. It is therefore possible to improve the precision of the on-chip noise measurement.

The loop element according to each of the foregoing exemplary embodiments can be used for applications where the loop antenna is fed with a signal for oscillation. Since the effect on surrounding circuits can be suppressed, it is possible to perform communication with higher power supply than heretofore.

The loop elements according to the foregoing exemplary embodiments can be manufactured by a semiconductor process since their looped conductor can be formed so as to satisfy the conductor density standard.

As described above, the first path that connects the second well to the bias power supply, the second path that electrically connects the third well to an independent ground, the third path that electrically connects the shield conductor to an independent ground, the looped conductor that constitutes the loop element, and the conductor(s) that constitutes/constitute the dummy metal(s) in the center of the loop may be all made of conductor wiring in the metal layer.

The foregoing exemplary embodiments have dealt with the cases where the first polarity and the second polarity are P-type and N-type, respectively. However, the present invention is not necessarily limited thereto, and may be applied when the first polarity and the second polarity are N-type and P-type, respectively.

Up to this point, the present invention has been described with reference to the exemplary embodiments, whereas the present invention is not limited to the foregoing exemplary embodiments. Various modifications understandable to those skilled in the art may be made to the configuration and details of the invention within the scope of the invention.

This application is based on and claims priority from prior Japanese Patent Application No. 2008-087117, filed 28 Mar. 2008, the entire contents of which are incorporated herein.

INDUSTRIAL APPLICABILITY

The present invention may be applied to an on-chip loop element that has a structure for shielding conductive noise propagating via the ground of a silicon substrate, may be applied to applications where a loop antenna is fed with a signal for oscillation, and may be applied to applications including an antenna such as an on-chip antenna for extreme proximity communication and a communication apparatus having such an antenna.

The invention claimed is:

1. A loop element comprising:
   a first well of a first polarity that is formed on a substrate;
   a deep well of a second polarity that is formed below the first well, the deep well being out of contact with the first well;
   a ring-shaped second well of a second polarity that is formed on the deep well along an outer periphery of the deep well;
   a third well of the first polarity that is formed in an area surrounded by the deep well and the second well;
   a looped conductor that is formed in a layer above the third well; and
   a first path that connects the second well to a bias power supply,
   the second well and the deep well being electrically connected to each other, and
   the bias power supply supplying a bias potential to the second well through the first path.

2. The loop element according to claim 1, further comprising
   a second path that electrically connects the third well to an independent ground.

3. The loop element according to claim 1, further comprising:
   a shield conductor that is arranged between the looped conductor and the third well, said shield conductor having a greater area than the looped conductor; and
   a third path that electrically connects the shield conductor to an independent ground.

4. The loop element according to claim 3, wherein the third well is electrically connected to the shield conductor.

5. The loop element according to claim 1, further comprising conductors that are arranged inside and outside the looped conductor so as not to be connected with the looped conductor,
   the conductors being arranged to have an annular opening along the looped conductor.

6. The loop element according to claim 5, wherein the conductor arranged inside the looped conductor comprises plurality of conductors such that smaller conductors are arranged closer to a center of the loop.

7. The loop element according to claim 1, wherein at least the first path and the looped conductor comprise a conductor wiring in a metal layer.

8. A noise analyzer comprising:
   the loop element according to claim 1;
   a looped conductor that is arranged independent from the loop element;
   measurement circuits that measure voltages at terminals of the loop element and the looped conductor, respectively; and
   an analysis circuit that performs a computation to determine a magnetic field by using a measurement of the voltage induced across the terminals of the loop element and a measurement of the voltage induced across the terminals of the looped conductor.

9. The noise analyzer according to claim 8, wherein the loop element is arranged near a noise source to be measured.

10. A semiconductor apparatus comprising the loop element according to claim 1.

11. An antenna comprising the loop element according to claim 1.

12. A communication apparatus comprising the antenna according to claim 11.

13. The loop element according to claim 1, wherein the looped conductor includes a loop wiring comprising a cutting portion and leads connected at respective cut ends of the cutting portion.

14. The loop element according to claim 1, wherein said deep-well is formed entirely below said first well.

15. The loop element according to claim 1, wherein said deep-well is formed entirely below said third well.

16. A noise analyzer comprising:
   the loop element according to claim 1;
   a looped conductor that is arranged independently from the loop element; and
   a measurement circuit that measures voltages at terminals of the loop element and the looped conductor, respectively.

17. A noise analyzer comprising:
   the loop element according to claim 1; and
   an analysis circuit that performs a computation to determine a magnetic field by using a measurement of a voltage induced across a terminal of the loop element and a measurement of a voltage induced across a terminal of the looped conductor.

18. The loop element according to claim 1, wherein a conductor is arranged in a center portion of the looped conductor.

19. The loop element according to claim 18, wherein said conductor is electrically isolated from the looped conductor.

20. The loop element according to claim 1, wherein an outer dimension of the looped conductor is less than an outer dimension of the third well.

* * * * *